(12) United States Patent
Xiao et al.

(10) Patent No.: US 12,376,281 B2
(45) Date of Patent: Jul. 29, 2025

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 500 days.

(21) Appl. No.: 17/818,509

(22) Filed: Aug. 9, 2022

(65) Prior Publication Data
US 2023/0171942 A1    Jun. 1, 2023

Related U.S. Application Data

(63) Continuation of application No. PCT/CN2022/077639, filed on Feb. 24, 2022.

(30) Foreign Application Priority Data

Nov. 30, 2021  (CN) .......................... 202111444498.7

(51) Int. Cl.
*H10B 12/00*  (2023.01)
*H10D 30/01*  (2025.01)

(52) U.S. Cl.
CPC .......... *H10B 12/05* (2023.02); *H10B 12/315* (2023.02); *H10B 12/482* (2023.02)

(58) Field of Classification Search
CPC .... H10B 12/05; H10B 12/315; H10B 12/482; H10B 12/31; H10B 12/488; H10D 30/025; H10D 64/252
See application file for complete search history.

(56) References Cited

U.S. PATENT DOCUMENTS 8,946,670 B1    2/2015  Park
9,112,032 B1    8/2015  Liu et al.
(Continued)

FOREIGN PATENT DOCUMENTS

CN    104425608 A    3/2015
CN    108389896 A    8/2018
(Continued)

OTHER PUBLICATIONS

International Search Report cited in PCT/CN2022/077639 mailed May 19, 2022, 9 pages.
(Continued)

*Primary Examiner* — David Vu
(74) *Attorney, Agent, or Firm* — Kilpatrick Townsend & Stockton LLP

(57) ABSTRACT

The present disclosure provides a manufacturing method of a semiconductor structure and a semiconductor structure. The manufacturing method of a semiconductor structure includes: providing a substrate; forming a plurality of active pillars on the substrate, where each of the active pillars includes a first segment, a second segment, and a third segment; forming a first gate oxide layer on a sidewall of the second segment, a top surface of the first segment, and a bottom surface of the third segment; and forming a second gate oxide layer on the first gate oxide layer, where a length
(Continued)

of the second gate oxide layer is less than that of the first gate oxide layer, and a thickness of the second gate oxide layer is greater than that of the first gate oxide layer.

13 Claims, 7 Drawing Sheets

(56) References Cited

U.S. PATENT DOCUMENTS

| | | |
|---|---|---|
| 2006/0043472 A1 | 3/2006 | Wang et al. |
| 2007/0082448 A1 | 4/2007 | Kim et al. |
| 2011/0121396 A1 | 5/2011 | Lee |
| 2019/0296155 A1* | 9/2019 | Sawabe .................. H10B 12/31 |
| 2021/0296316 A1 | 9/2021 | Zhu |

FOREIGN PATENT DOCUMENTS

| | | |
|---|---|---|
| CN | 108807545 A | 11/2018 |
| CN | 109449158 A | 3/2019 |
| CN | 109841522 A | 6/2019 |
| CN | 109979880 A | 7/2019 |
| CN | 113611671 A | 11/2021 |

OTHER PUBLICATIONS

First Office Action cited in CN202111444498.7, mailed May 16, 2022, 23 pages.
International Search Report cited in PCT/CN2022/077681 mailed Aug. 9, 2022, 8 pages.

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2022/077639, filed on Feb. 24, 2022, which claims the priority to Chinese Patent Application No. 202111444498.7, titled "MANUFACTURING METHOD OF SEMICONDUCTOR STRUCTURE AND SEMICONDUCTOR STRUCTURE" and filed on Nov. 30, 2021. The entire contents of International Patent Application No. PCT/CN2022/077639 and Chinese Patent Application No. 202111444498.7 are incorporated herein by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure. The manufacturing method of a semiconductor structure includes:
  providing a substrate;
  forming a plurality of active pillars on the substrate, where the active pillars are arranged as an array, each of the active pillars includes, along a first direction, a first segment, a second segment, and a third segment that are sequentially connected, and along the first direction, sectional area of the second segment is less than that of the first segment and the third segment;
  forming a first gate oxide layer on a sidewall of the second segment, a top surface of the first segment, and a bottom surface of the third segment; and
  forming a second gate oxide layer on the first gate oxide layer, where along the first direction, a length of the second gate oxide layer is less than that of the first gate oxide layer, the second gate oxide layer is disposed close to the third segment, and a thickness of the second gate oxide layer is greater than that of the first gate oxide layer.

A second aspect of the present disclosure provides a semiconductor structure, where the semiconductor structure includes:
  a substrate;
  a plurality of active pillars arranged as an array in the substrate, where each of the active pillars includes, along a first direction, a first segment, a second segment, and a third segment that are sequentially connected, and along a second direction, sectional area of the second segment is less than that of the first segment and the third segment;
  a first gate oxide layer, where the first gate oxide layer is disposed on a sidewall of the second segment, a top surface of the first segment, and a bottom surface of the third segment; and
  a second gate oxide layer, where the second gate oxide layer is disposed on an outer side of the first gate oxide layer, along the first direction, a length of the second gate oxide layer is less than that of the first gate oxide layer, the second gate oxide layer is disposed close to the third segment, and a thickness of the second gate oxide layer is greater than that of the first gate oxide layer.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

Figure 1:
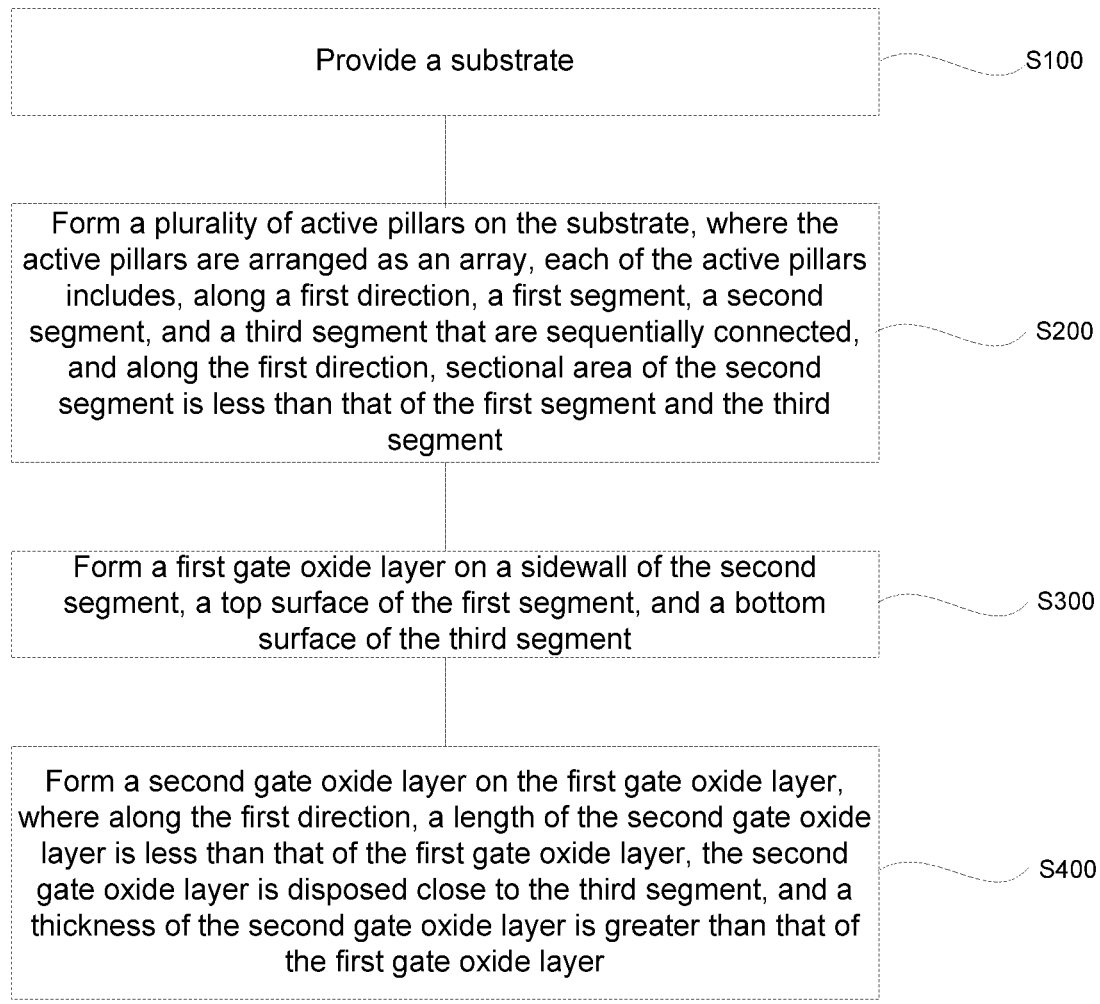
FIG. 1 is a flowchart of a manufacturing method of a semiconductor structure according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In a semiconductor structure, the transistor can be understood as a current switch structure made of a semiconductor material. A metal gate is disposed between the source and the drain of the transistor, and the metal gate can be used to control on/off of a current between the source and the drain. A gate-all-around (GAA) transistor adopts a GAA technology. With the development of semiconductor processes, a size of a semiconductor device is becoming smaller. In addition, GIDL occurs in a process of forming a structure of the GAA transistor, reducing performance and a yield of the semiconductor structure.

In a manufacturing method of a semiconductor structure and a semiconductor structure provided in the embodiments of the present disclosure, a first gate oxide layer is formed on a sidewall of a second segment of an active pillar, and a second gate oxide layer is formed on the first gate oxide layer, so as to increase a charge storage capability of a gate oxide layer, and effectively reduce GIDL currents and interband tunneling. In addition, a length of the second gate oxide layer is less than that of the first gate oxide layer, a thickness of the second gate oxide layer is greater than that of the first gate oxide layer, and the second gate oxide layer is disposed close to a third segment, such that gate oxide layers with different thickness are formed at different positions of the second segment, which is conducive to controlling a turn-off current of a semiconductor structure and effectively improving performance and a yield of the semiconductor structure.

Exemplary embodiments of the present disclosure provide a manufacturing method of a semiconductor structure. The following describes the manufacturing method of a semiconductor structure with reference to FIG. 1 to FIG. 18.

There are no limits made on the semiconductor structure in the embodiments. The semiconductor structure is described below by using a DRAM as an example, but is not limited thereto in the embodiments. Alternatively, the semiconductor structure in the embodiments may be another structure, for example, a GAA transistor or a vertical gate-all-around (VGAA) transistor.

As shown in FIG. 1, an exemplary embodiment of the present disclosure provides a manufacturing method of a semiconductor structure, including the following steps:

Step S100: Provide a substrate.

Step S200: Form a plurality of active pillars on the substrate, where the active pillars are arranged as an array, each of the active pillars includes, along a first direction, a first segment, a second segment, and a third segment that are sequentially connected, and along the first direction, sectional area of the second segment is less than that of the first segment and the third segment.

Step S300: Form a first gate oxide layer on a sidewall of the second segment, a top surface of the first segment, and a bottom surface of the third segment.

Step S400: Form a second gate oxide layer on the first gate oxide layer, where along the first direction, a length of the second gate oxide layer is less than that of the first gate oxide layer, the second gate oxide layer is disposed close to the third segment, and a thickness of the second gate oxide layer is greater than that of the first gate oxide layer.

According to an exemplary embodiment, this embodiment is a further description of step S100 described above. The manufacturing method of a semiconductor structure in this embodiment includes the following content.

As shown in FIG. 1, the substrate 10 is provided. The substrate 10 serves as a support member of a DRAM and is configured to support other components provided thereon. The substrate 10 may be made of a semiconductor material. The semiconductor material may be one or more of silicon, germanium, a silicon-germanium compound, and a silicon-carbon compound.

According to an exemplary embodiment, this embodiment is a further description of step S200 described above. The manufacturing method of a semiconductor structure in this embodiment includes the following content.

Figure 10:
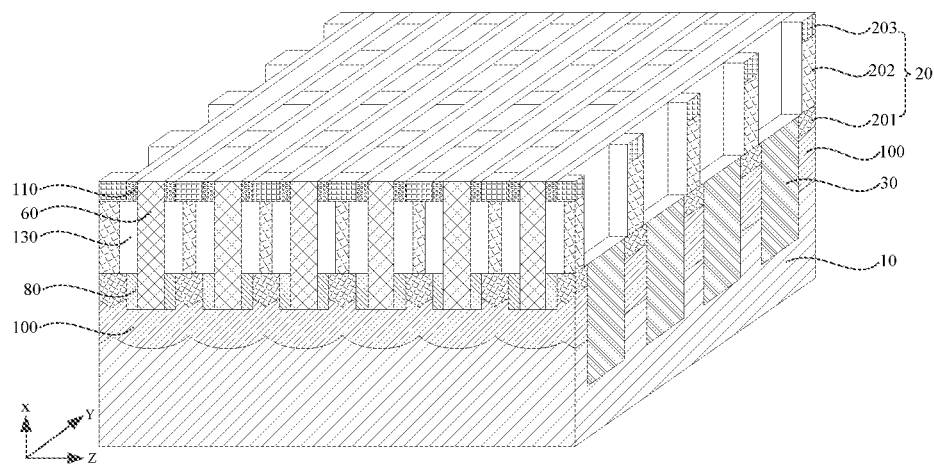
FIG. 10 is a schematic diagram of forming a third trench in a manufacturing method of a semiconductor structure according to an exemplary embodiment.

As shown in FIG. 10, the active pillars 20 are formed on the substrate 10. The active pillars 20 are arranged as the array on the substrate 10, in other words, the active pillars 20 can be arranged in a plurality of rows and a plurality of columns.

Figure 2:
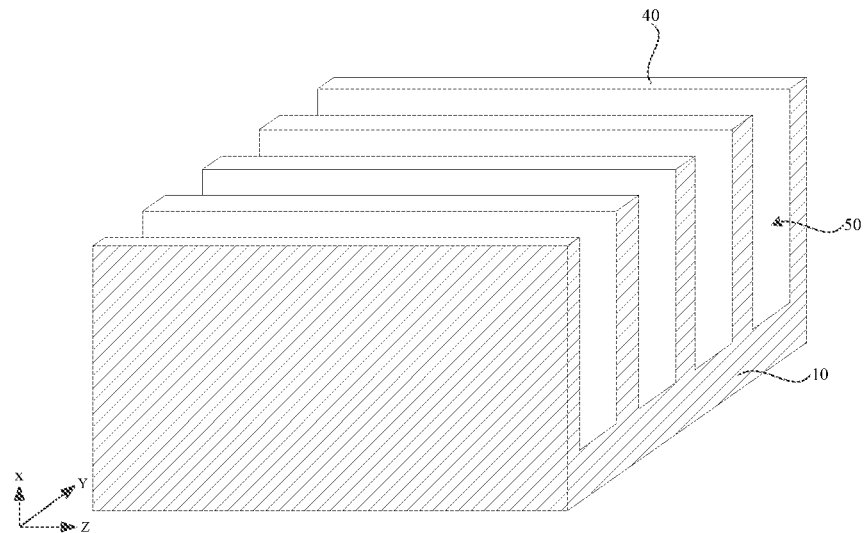
FIG. 2 is a schematic diagram of forming a strip body in a manufacturing method of a semiconductor structure according to an exemplary embodiment.
Figure 3:
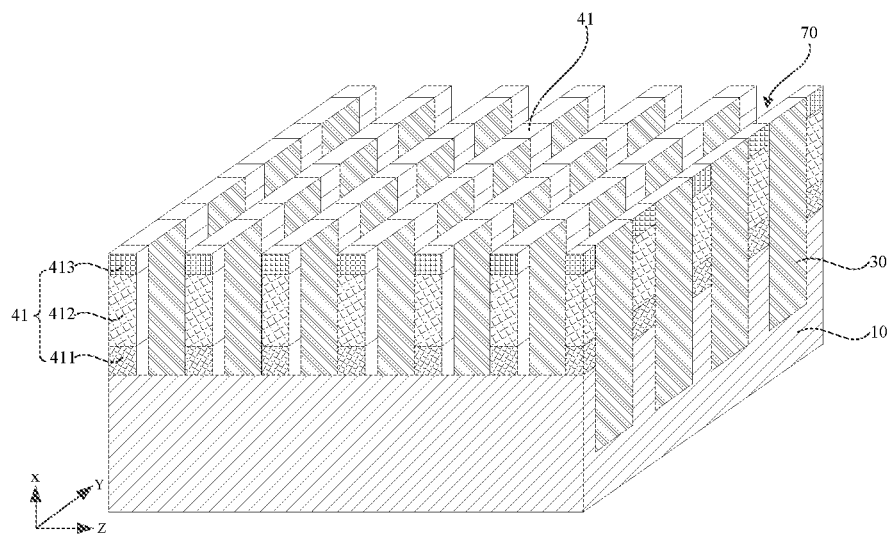
FIG. 3 is a schematic diagram of forming a silicon pillar structure in a manufacturing method of a semiconductor structure according to an exemplary embodiment.

In some embodiments, the active pillars 20 arranged as the array may be formed on the substrate 10 by using the following method:

Referring to FIG. 3, a plurality of bit line isolation structures 30 disposed at intervals along a second direction Y are formed in the substrate 10, where the substrate 10 between adjacent ones of the bit line isolation structures 30 forms a strip body 40. Referring to FIG. 2, using an orientation shown in the figure as an example, the second direction Y is an extension direction perpendicular to a front side surface of the substrate 10.

In some embodiments, referring to FIG. 3, in a process of forming the bit line isolation structure 30 on the substrate 10, a mask layer with a mask pattern can be first formed on the substrate 10, a direction from a top surface of the substrate 10 to a bottom surface of the substrate 10 is taken as an extension direction, and along the extension direction, a part of the substrate 10 is removed based on the mask pattern to form a plurality of bit line trenches 50 disposed at intervals along the second direction Y (referring to the direction shown in FIG. 2).

Then, the bit line isolation structure 30 is formed in the bit line trench 50 by using an ALD process, a chemical vapor deposition (CVD) process, or a physical vapor deposition (PVD) process. A material of the bit line isolation structure 30 may include, but is not limited to, monox or silicon nitride. In some embodiments, the bit line isolation structure 30 may alternatively be an oxide-nitride-oxide (ONO) structure, but is not limited thereto. The bit line isolation structure 30 formed in the substrate 10 can realize an insulation effect between adjacent bit lines subsequently formed in the substrate 10, and ensure performance and a yield of a semiconductor structure.

Figure 4:
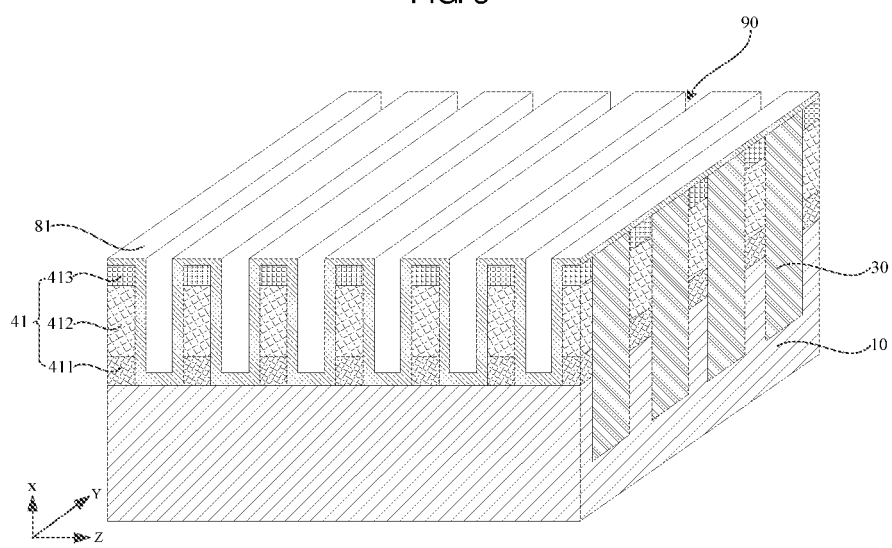
FIG. 4 is a schematic diagram of forming a first initial dielectric layer and a silicon pillar in a manufacturing method of a semiconductor structure according to an exemplary embodiment.

As shown in FIG. 4, after the strip body 40 is formed, the strip body 40 is processed to form a silicon pillar structure 41.

The processing performed on the strip body 40 includes processing the strip body 40 by using an ion implantation process. For example, ion implantation energy and a type of implanted doped ions in an ion implantation process can be controlled first to form a first part 411 at the bottom of the silicon pillar structure 41. Then, the ion implantation energy and the type of the implanted doped ions in the ion implantation process are controlled to form a second part 412 in the middle of the silicon pillar structure 41. Finally, the ion implantation energy and the type of the implanted doped ions in the ion implantation process are controlled to form a third part 413 on the top of the silicon pillar structure 41. The type of the doped ions in the first part 411 may be the same as that of the doped ions in the third part 413, for example, the doped ions may include N-type ions. The type of the doped ions in the second part 412 is different from that of doped ions in a drain region, for example, the doped ions may include P-type ions.

It should be noted that the first part 411 can be used as either a source region or a drain region of the subsequently formed active pillar 20, the second part 412 can be used as a channel region of the subsequently formed active pillar 20, and the third part 413 can be used as either the source region or the drain region of the subsequently formed active pillar 20. For example, if the first part 411 is used as the source region, correspondingly, the third part 413 is used as the drain region.

Figure 6:
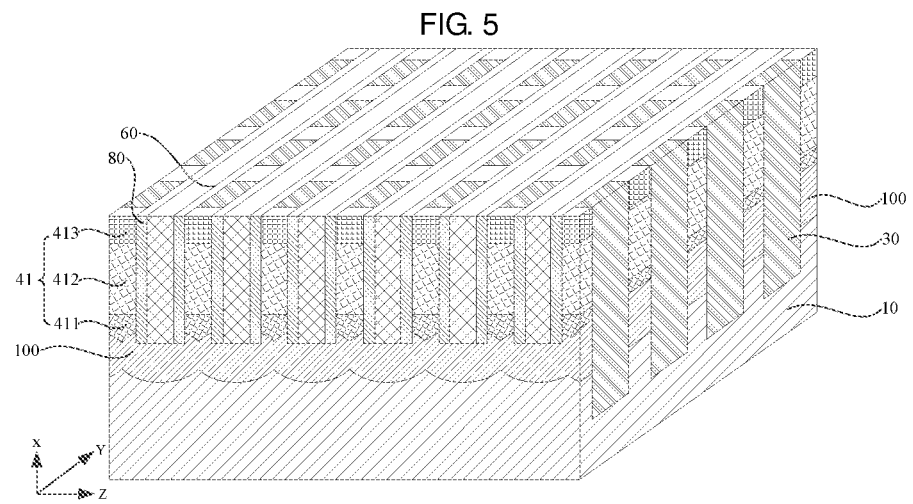
FIG. 6 is a schematic diagram of forming a first dielectric layer and a word line isolation structure in a manufacturing method of a semiconductor structure according to an exemplary embodiment.

As shown in FIG. 6, after the silicon pillar structure 41 is formed, a plurality of word line isolation structures 60 are formed in the substrate 10. The word line isolation structures 60 are disposed at intervals along a third direction Z. Referring to FIG. 6, using an orientation shown in the figure as an example, the third direction Z is an extension direction parallel to the front side surface of the substrate 10. The second direction Y intersects the third direction Z on a same horizontal plane, where the second direction Y may be perpendicular to the third direction Z, or the second direction Y may intersect the third direction Z at a predetermined angle.

In some embodiments, in a process of forming the word line isolation structure 60 on the substrate 10, a mask layer with a mask pattern can be first formed on the top surface of the substrate 10, the direction from the top surface of the substrate 10 to the bottom surface of the substrate 10 is taken as an extension direction, and along the extension direction, a part of the substrate 10 is removed based on the mask pattern to form a plurality of word line trenches 70 disposed at intervals along the third direction Z. A depth of the word line trench 70 is less than that of the bit line trench 50.

Then, a first dielectric layer 80 is formed on a sidewall of the word line trench 70 by using the ALD process, the CVD process, or the PVD process.

Figure 5:
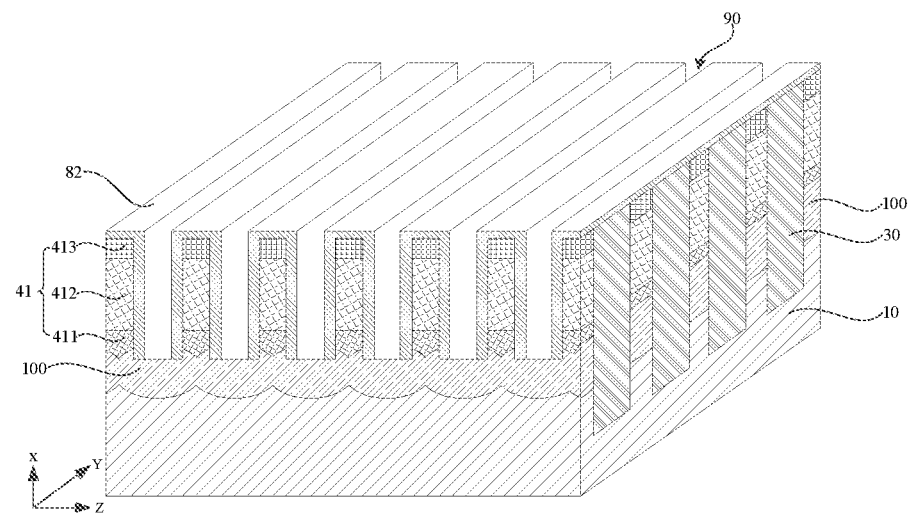
FIG. 5 is a schematic diagram of forming a first transition dielectric layer and a bit line in a manufacturing method of a semiconductor structure according to an exemplary embodiment.

In a process of forming the first dielectric layer 80, as shown in FIG. 4 and FIG. 5, in an embodiment, a first initial dielectric layer 81 may be formed on the sidewall of the word line trench 70, at the bottom of the word line trench 70, on a top surface of the silicon pillar structure 41, and on a top surface of the bit line isolation structure 30 by using the ALD process. Then, along a direction opposite to the first direction X, the first initial dielectric layer 81 at the bottom of the word line trench 70 is removed through etching, and the reserved first initial dielectric layer 81 on the sidewall of the word line trench 70, the top surface of the silicon pillar structure 41, and the top surface of the bit line isolation structure 30 forms a first transition dielectric layer 82. The first transition dielectric layer 82 can protect a sidewall and the top surface of the silicon pillar structure 41 to prevent another structure subsequently formed in the substrate 10 from causing a damage to a silicon pillar 42. A material of the first transition dielectric layer 82 may include silicon nitride, silicon dioxide, or silicon oxynitride.

After the first transition dielectric layer 82 is formed, a first trench 90 is formed between first transition dielectric layers 82 on both sidewalls of the word line trench 70 along the second direction Y.

As shown in FIG. 6, the word line isolation structure 60 is formed in the first trench 90. In some embodiments, before the word line isolation structure 60 is formed in the first trench 90, a plurality of bit lines 100 are formed in the first trench 90. The bit lines 100 are disposed at intervals along the second direction Y.

In an embodiment, cobalt (Co), a nickel platinum (NiPt) alloy, or the like can be implanted into the bottom of the first trench 90 by using the ion implantation process, and the Co or the NiPt alloy reacts with the substrate 10 to form cobalt silicide (CoSi) or platinum nickel silicide (PtNiSi). After annealing, the CoSi or the PtNiSi diffuses to a bottom surface of the active pillar 20 in the substrate 10 to form one bit line 100. The bit line 100 can be connected to first segments of a plurality of subsequently formed active pillars 20 that are along the third direction Z and in a same straight line.

The bit line forming method in this embodiment is simple and easy to control and operate. It should be noted that the bit line can be connected to a drain of the subsequently formed active pillar 20. In a transistor, a gate is connected to a word line, and a source is connected to a capacitor structure. A voltage signal on the word line controls the transistor to turn on or off, and then data information stored in the capacitor structure is read through the bit line, or data information is written into the capacitor structure through the bit line for storage.

Referring to FIG. 6, an initial word line isolation structure is formed in the first trench 90. A filling material is filled into the first trench 90 by using the ALD process, the CVD process, or the PVD process, to form the initial word line isolation structure, and a top surface of the initial word line isolation structure is flush with a top surface of the first transition dielectric layer 82. Suitable filling materials include an insulating material. In some embodiments, the filling material includes a nitride, an oxide, a high-k dielectric material, or another suitable insulating material.

After the initial word line isolation structure is formed, a part of the first transition dielectric layer 82 and a part of the initial word line isolation structure are removed through chemical mechanical polishing, to expose a top surface of the silicon pillar 42. The reserved first transition dielectric layer 82 forms the first dielectric layer 80, and the reserved initial word line isolation structure forms the word line isolation structure 60. Through chemical mechanical polishing, a surface of the first dielectric layer 80, a surface of the word line isolation structure 60, and a surface of the silicon pillar are planarized, thereby reducing defect density and improving the yield of the semiconductor structure.

After the word line isolation structure 60 is formed, the silicon pillar structure 41 between adjacent word line isolation structures 60 and the silicon pillar structure 41 between adjacent bit line isolation structures 30 on the substrate 10 form the silicon pillar 42. It should be noted that the first part 411 of the silicon pillar structure 41 forms a lower segment of the silicon pillar 42, the second part 412 of the silicon pillar structure 41 forms a middle segment of the silicon pillar 42, and the third part 413 of the silicon pillar structure 41 forms an upper segment of the silicon pillar 42. The word line isolation structure 60 is used to realize insulation between adjacent bit lines subsequently formed in the substrate 10, and ensure the performance and the yield of the semiconductor structure.

Figure 8:
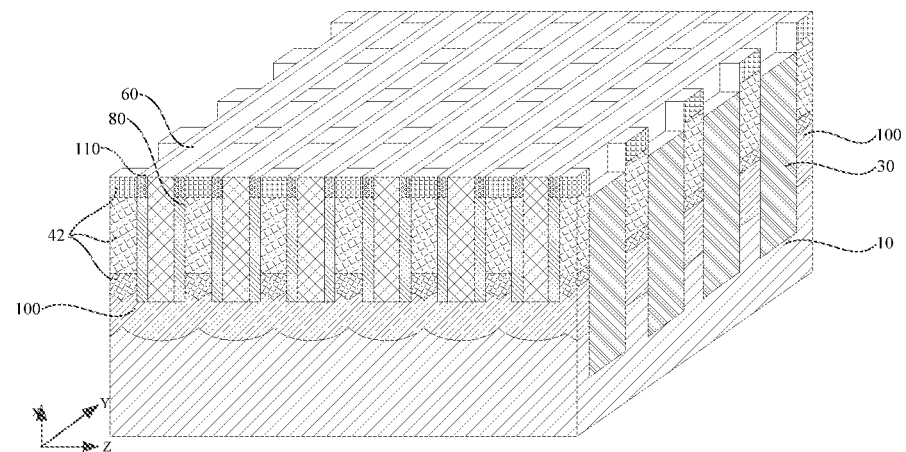
FIG. 8 is a schematic diagram of forming a support structure in a manufacturing method of a semiconductor structure according to an exemplary embodiment.

For example, as shown in FIG. 8, after the word line isolation structure 60 is formed in the substrate 10, in order to facilitate subsequent preprocessing on the silicon pillar to form the active pillar 20, and improve accuracy of the subsequently formed gate oxide layer and other structures, a support structure 110 is first formed on both sides of the word line isolation structure 60.

Figure 7:
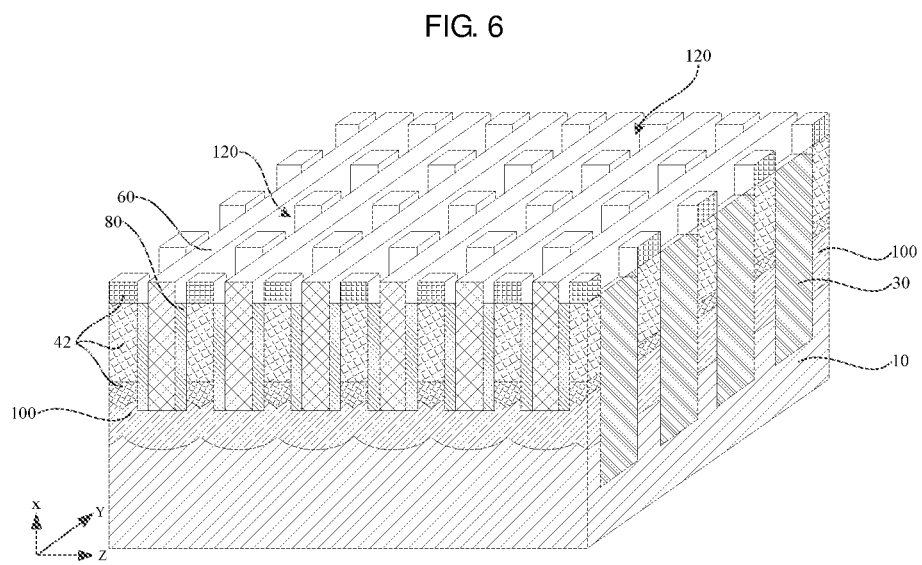
FIG. 7 is a schematic diagram of forming a second trench in a manufacturing method of a semiconductor structure according to an exemplary embodiment.

Referring to FIG. 7, in some embodiments, the first dielectric layer 80 and the bit line isolation structure 30 can be etched to remove a part of the first dielectric layer 80 and a part of the bit line isolation structure 30, so as to expose a part of the word line isolation structure 60 and a partial structure of the silicon pillar 42. Along the second direction Y, a second trench 120 is formed on a top surface of the reserved bit line isolation structure 30 and between the exposed word line isolation structure 60 and silicon pillar 42.

After that, an initial support structure can be formed in the second trench 120 by using the ALD process, the CVD process, or the PVD process. In some embodiments, the initial support structure may be deposited in the second trench 120 by using the ALD process, and the initial support structure fills the second trench 120. Then, a part of the initial support structure is removed through etching, and the initial support structure located on both sides of the word line isolation structure 60 is reserved, where the reserved initial support structure forms the support structure 110. The support structure 110 is disposed at intervals along the third direction. It should be noted that a material of the support structure 110 may include, but is not limited to, silicon nitride.

In this embodiment, the support structure 110 is formed by using the ALD process. This can improve density of a film layer of the support structure 110 to prevent inclination of the third segment 203 of the active pillar 20 in a subsequent word line formation process, so as to ensure accuracy of the subsequently formed first gate oxide layer 140 and second gate oxide layer 160, and further improve the performance and the yield of the semiconductor structure.

Referring to FIG. 10, a part of the silicon pillar 42 is preprocessed to form the active pillar 20. The preprocessing includes oxidation processing. In an example, the middle segment of the silicon pillar 42 is oxidized and then etched or cleaned, such that the silicon pillar 42 forms the active pillar 20. It should be understood that the middle segment of the silicon pillar 42 in this embodiment is the second part 412 of the silicon pillar structure 41 in the above embodiment.

Figure 9:
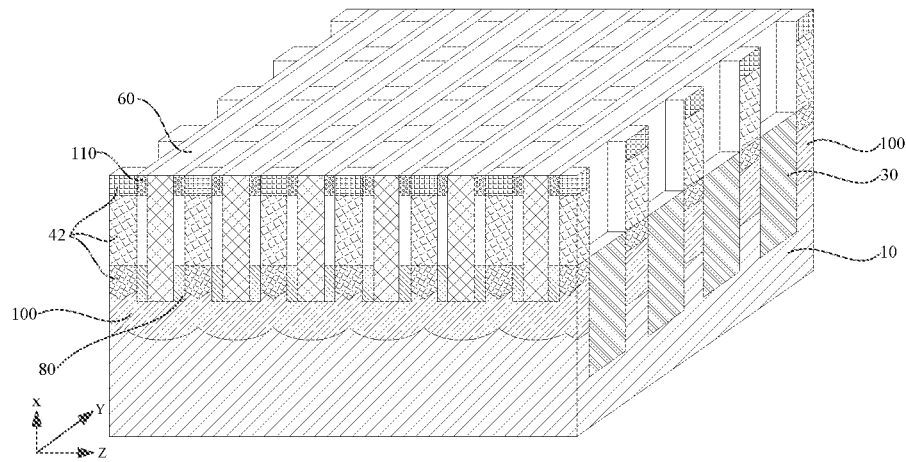
FIG. 9 is a schematic diagram of removing a part of a first dielectric layer in a manufacturing method of a semiconductor structure according to an exemplary embodiment.

In some embodiments, as shown in FIG. 9, before the middle segment of the silicon pillar 42 is oxidized, a part of the first dielectric layer 80 and a part of the bit line isolation structure 30 are removed through etching along the direction opposite to the first direction X. Etching endpoints of the first dielectric layer 80 and the bit line isolation structure 30 are located at a junction of the lower segment and the middle segment of the silicon pillar 42, in other words, the whole middle segment of the silicon pillar 42 is exposed. In some embodiments, etching depths of the first dielectric layer 80 and the bit line isolation structure 30 may also be located at two-thirds of a height of the subsequently formed active pillar 20, in other words, a height of the reserved first dielectric layer 80 may be one-third of the height of the active pillar 20.

After the part of the first dielectric layer 80 and the part of the bit line isolation structure 30 are etched, the exposed middle segment of the silicon pillar 42 is oxidized to remove a part of the middle segment of the silicon pillar 42 along a radial direction of the silicon pillar 42. It should be noted that in some embodiments, the oxidation processing includes thermal oxidation or steam oxidation. In the oxidation processing, the middle segment of the silicon pillar 42 is exposed to the outside. Through thermal oxidation or steam oxidation, an oxide layer, such as monox, is formed on a surface of the middle segment, and then the oxide layer can be removed through etching or cleaning, so as to remove the part of the middle segment of the silicon pillar 42.

After the oxidation processing, the lower segment of the silicon pillar 42 forms the first segment 201 of the active pillar 20, and the first segment 201 can form the drain or the source of the active pillar 20; the reserved middle segment of the silicon pillar 42 forms the second segment 202 of the active pillar 20, and the second segment 202 can form a channel region of the active pillar 20; and the upper segment of the silicon pillar 42 forms the third segment 203 of the active pillar 20, and the third segment 203 can form the source or the drain of the active pillar 20. Therefore, taking a plane perpendicular to the first direction X as a cross section, the sectional area of the second segment 202 is less than that of the first segment 201 and the third segment 203. In an example, the first segment 201 of the active pillar 20 forms the drain, and the third segment 203 of the active pillar 20 forms the source.

According to an exemplary embodiment, this embodiment is a further description of step S300 described above. The manufacturing method of a semiconductor structure in this embodiment includes the following content.

Figure 11:
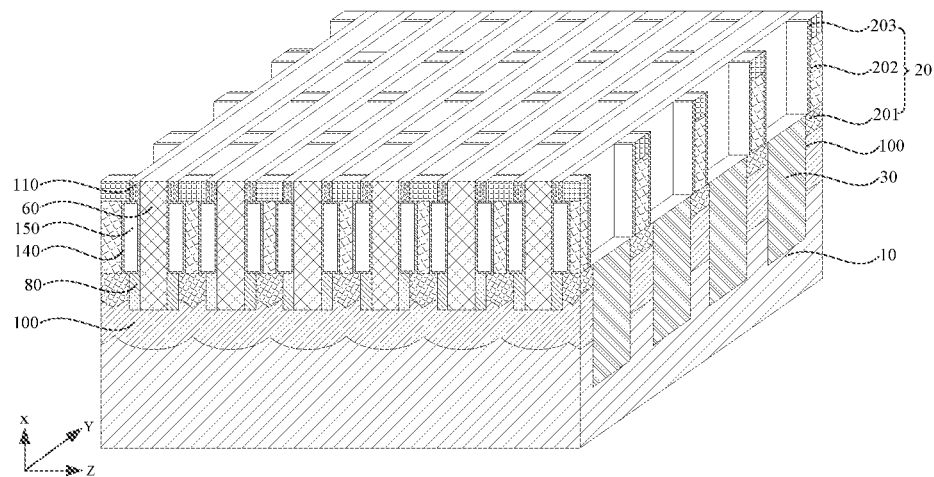
FIG. 11 is a schematic diagram of forming a first gate oxide layer in a manufacturing method of a semiconductor structure according to an exemplary embodiment.

As shown in FIG. 10 and FIG. 11, the first gate oxide layer 140 is formed on the sidewall of the second segment 202 of the active pillar 20, the top surface of the first segment 201, and the bottom surface of the third segment 203.

After the active pillars 20 arranged as the array are formed by performing the above steps, a third trench 130 is formed between the sidewall of the second segment 202 of the active pillar 20 and the word line isolation structure 60 along an extension direction of the first direction X.

Then, the first gate oxide layer 140 is formed on a sidewall of the third trench 130 by using the ALD process. The ALD process is characterized by a low deposition rate, high density of a deposited film layer, and good step coverage. The first gate oxide layer 140 formed by using the ALD process can effectively isolate and protect the second segment, namely, a gate, of the active pillar when the first gate oxide layer 140 is relatively thin, and can avoid occupying large space, thereby facilitating subsequent filling or formation of another structure layer. A material of the first gate oxide layer 140 may include, but is not limited to, silicon dioxide, silicon monoxide, hafnium oxide, or titanium oxide.

According to an exemplary embodiment, this embodiment is a further description of step S400 described above. The manufacturing method of a semiconductor structure in this embodiment includes the following content.

The second gate oxide layer 160 is formed on the first gate oxide layer 140. Along the first direction X, the length of the second gate oxide layer 160 is less than that of the first gate oxide layer 140, and the thickness of the second gate oxide layer 160 is greater than that of the first gate oxide layer 140.

Figure 12:
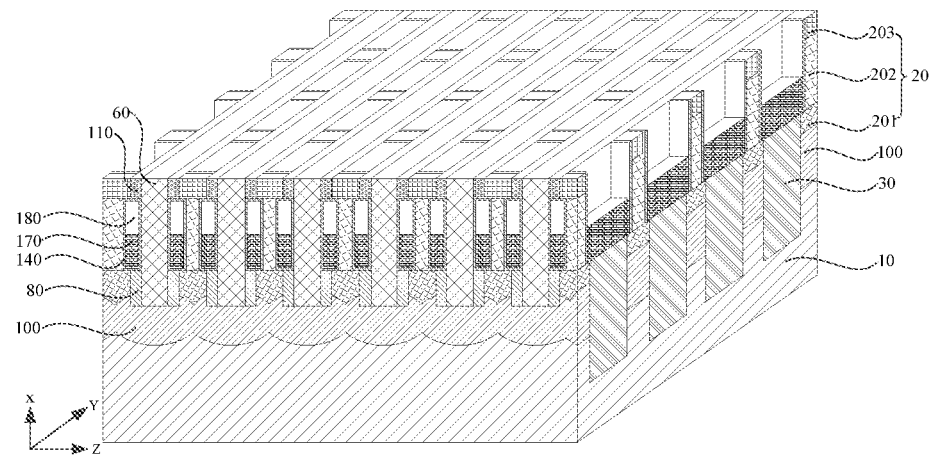
FIG. 12 is a schematic diagram of forming a first word line in a manufacturing method of a semiconductor structure according to an exemplary embodiment.

The second gate oxide layer 160 may be formed by using the following method:

Referring to FIG. 11 and FIG. 12, after the first gate oxide layer 140 is formed, the first gate oxide layer 140 located in the third trench 130 forms a fourth trench 150.

A first initial word line (not shown in the figure) is formed in the fourth trench 150 by using the ALD process, the PVD process, or the CVD process. The first initial word line fills the fourth trench 150.

After that, referring to FIG. 12, a part of the first initial word line is removed through etching. Along the extension direction of the first direction X, an etching endpoint of the first initial word line may be between one-third and two-thirds of a height of the second segment 202. In an embodiment, the etching endpoint of the first initial word line is located at a half height of the second segment 202. Thus, the reserved first initial word line forms a first word line 170. A material of the first word line 170 includes, but is not limited to, tungsten or polycrystalline silicon. A fifth trench 180 is formed between a top surface of the first word line 170 and the exposed first gate oxide layer 140.

Then, a second initial gate oxide layer is formed on the fifth trench 180 by using the ALD process, the second initial gate oxide layer on the top surface of the first word line 170 is removed through etching, the second initial gate oxide layer on a sidewall and a top surface of the fifth trench 180 is reserved, and the reserved second initial gate oxide layer forms the second gate oxide layer 160. The second gate oxide layer 160 formed by using the ALD process can effectively isolate and protect the second segment, namely, the gate, of the active pillar when the second gate oxide layer 160 is relatively thin, and can avoid occupying large space, thereby facilitating subsequent filling or formation of another structure layer.

A material of the second gate oxide layer 160 may include, but is not limited to, silicon dioxide, silicon monoxide, hafnium oxide, or titanium oxide. The second gate oxide layer 160 and the first gate oxide layer 140 may be made of a same material or different materials.

Before the second gate oxide layer 160 is formed, the first word line 170 with a preset thickness is formed in the fourth trench 150, such that a length of the second gate oxide layer 160 in the first direction X is less than that of the first gate oxide layer 140. In addition, in a process of forming the second gate oxide layer 160, the thickness of the second gate oxide layer 160 is controlled to be greater than that of the first gate oxide layer 140.

In the semiconductor structure, a GIDL current exists in a GAA transistor. The reason for this kind of transistor to generate the GIDL current is that a thickness of a gate oxide layer is small, which reduces a charge storage capability of the gate oxide layer. When the GAA transistor is in a static state, electrons generated by a gate or a small quantity of carrier fluids enter a drain of the transistor through the gate oxide layer, which causes a high electric field effect to the drain of the transistor, resulting in a leakage current at the drain. In this embodiment, the first gate oxide layer 140 and the second gate oxide layer 160 are successively formed on the sidewall of the second segment 202 of the active pillar 20, such that thicknesses of gate oxide layers at different positions on the second segment 202 are different. This improves the charge storage capability of the gate oxide layer, prevents the electrons generated by the gate in the semiconductor structure or the small quantity of carrier fluids from entering the source or the drain of the semiconductor structure through the gate oxide layer, reduces the GIDL current, thereby improving the performance and the yield of the semiconductor structure.

Figure 13:
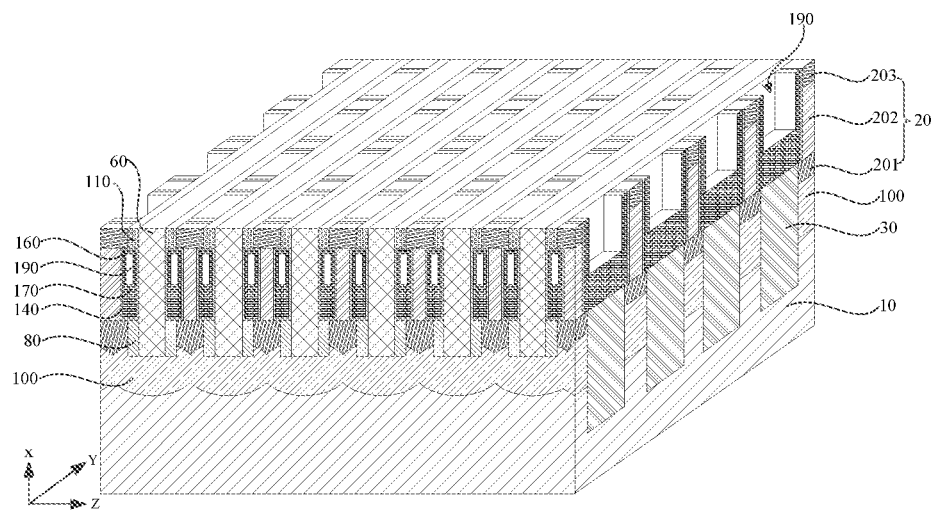
FIG. 13 is a schematic diagram of forming a second gate oxide layer in a manufacturing method of a semiconductor structure according to an exemplary embodiment.

Referring to FIG. 13, after the second gate oxide layer 160 is formed, a sixth trench 190 is formed on a sidewall of the second gate oxide layer 160 and the top surface of the first word line 170. Taking a plane perpendicular to the second direction Y as a longitudinal section, a shape of a longitudinal section of the second gate oxide layer 160 includes a horizontal segment disposed along a horizontal direction and two vertical segments disposed along a vertical direction, and both ends of the horizontal segment are connected to top surfaces of the two vertical segments.

Figure 14:
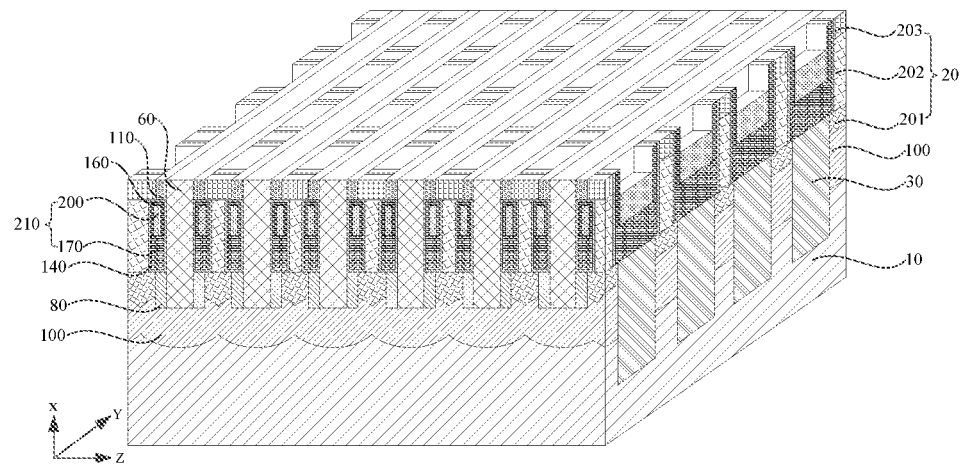
FIG. 14 is a schematic diagram of forming a second word line in a manufacturing method of a semiconductor structure according to an exemplary embodiment.

Then, referring to FIG. 14, a second initial word line is formed in the sixth trench 190 by using the ALD process, the PVD process, or the CVD process. The second initial word line fills the entire sixth trench 190.

A part of the second initial word line is removed through etching, where an etching endpoint of the second initial word line is flush with a bottom surface of the horizontal segment of the second gate oxide layer 160 located in the sixth trench 190. The reserved second initial word line forms a second word line 200. A material of the second word line 200 includes, but is not limited to, tungsten or polycrystalline silicon. The first word line 170 and the second word line 200 form a word line structure 210.

The first word line 170 and the second word line 200 may be made of a same material or different materials. In an embodiment, the first word line 170 and the second word line 200 may be made of tungsten or polycrystalline silicon. It should be noted that a thickness of a word line made of a material such as tungsten or polycrystalline silicon does not affect a potential of the word line.

In some embodiments, a gate structure with dual work functions is generally obtained by depositing word line metal layers of different materials at the gate, but a process required for depositing the metal layers of different materials is relatively complex, and an isolation layer is required between the metal layers of different materials due to a diffusion problem.

In this embodiment, at the second segment, namely, at the gate, the first word line 170 and the second word line 200 may be metal layers made of a same material, or both may be made of tungsten, polycrystalline silicon, or another material. Gate oxide layers with different thicknesses are disposed at different positions on the second segment 202 to achieve an effect of the dual work functions, such that a processing technology is simple and easier to control and realize. A thickness of a gate oxide layer that is of the second segment 202 close to the third segment 203 is greater than that of a gate oxide layer that is of the second segment 202 close to the first segment 201. Therefore, when the transistor formed by the semiconductor structure in this embodiment, such as the GAA transistor, is used, a thickness of a gate oxide layer that is of the gate and close to the source increases. In order to turn on the transistor, an additional turn-on voltage VT of a source terminal increases, which correspondingly increases a potential of the second word line 200, thereby making the potential of the second word line 200 higher than a potential of the first word line 170.

Further, when the additional turn-on voltage VT of the source terminal increases, a source voltage Vs of the source terminal increases. A relationship shown in the following formula exists between the turn-off current (I off) and the source voltage Vs, namely:

$$I\,off \propto e^{-(Vs*\varepsilon/kt)}$$

In the above formula, ε/kt represents a constant, which is about 0.0256. Therefore, when the source voltage Vs of the source increases, the turn-off current (I off) decreases. Since the turn-off current and the source voltage Vs meet an exponential relationship of e, when the thickness of the gate oxide layer of the source terminal of the transistor increases, the turn-off current decreases exponentially, so as to facilitate the control of the turn-off current of the semiconductor structure, thereby reducing the GIDL current and interband tunneling of the semiconductor structure and improving the performance and the yield of the semiconductor structure.

Figure 15:
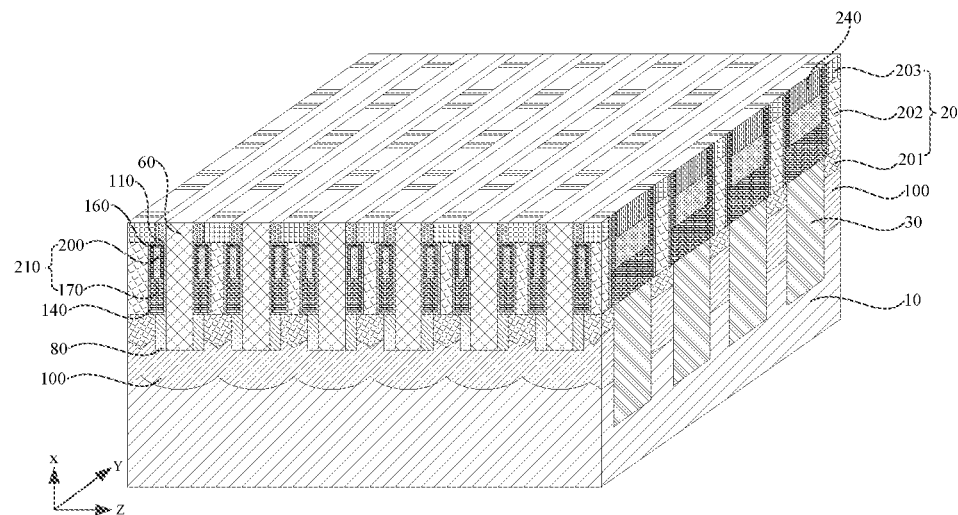
FIG. 15 is a schematic diagram of forming a second dielectric layer in a manufacturing method of a semiconductor structure according to an exemplary embodiment.

Referring to FIG. 15, in some embodiments, the thickness of the second gate oxide layer 160 is 1 to 2 times that of the first gate oxide layer 140. Therefore, in this embodiment, the thickness of the gate oxide layer that is of the second segment 202 and close to the third segment 203 is 2 to 3 times that of the gate oxide layer that is of the second segment 202 and close to the first segment 201. In a specific embodiment, the thickness of the second gate oxide layer 160 is 1.5 times that of the first gate oxide layer 140. The above thickness ratio is set, such that the turn-off current of the semiconductor structure can be reduced by 6 orders of magnitude. In addition, the GIDL current and interband tunneling of the semiconductor structure are also reduced, thereby improving the performance and the yield of the semiconductor structure.

Figure 16:
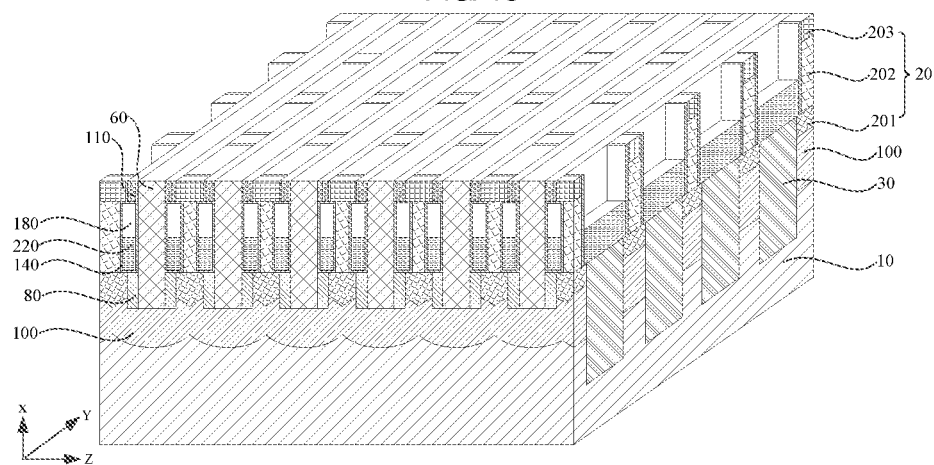
FIG. 16 is a schematic diagram of forming a sacrificial layer in a manufacturing method of a semiconductor structure according to an exemplary embodiment.
Figure 17:
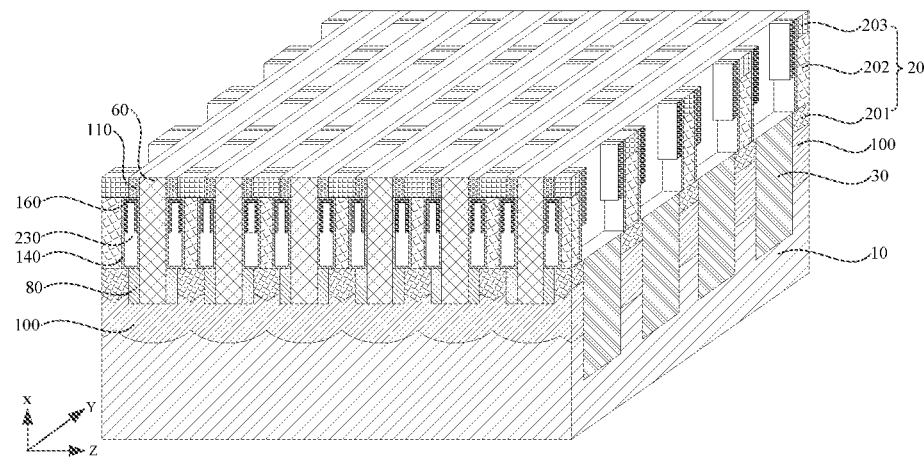
FIG. 17 is a schematic diagram of forming a second gate oxide layer and a seventh trench in a manufacturing method of a semiconductor structure according to an exemplary embodiment.
Figure 18:
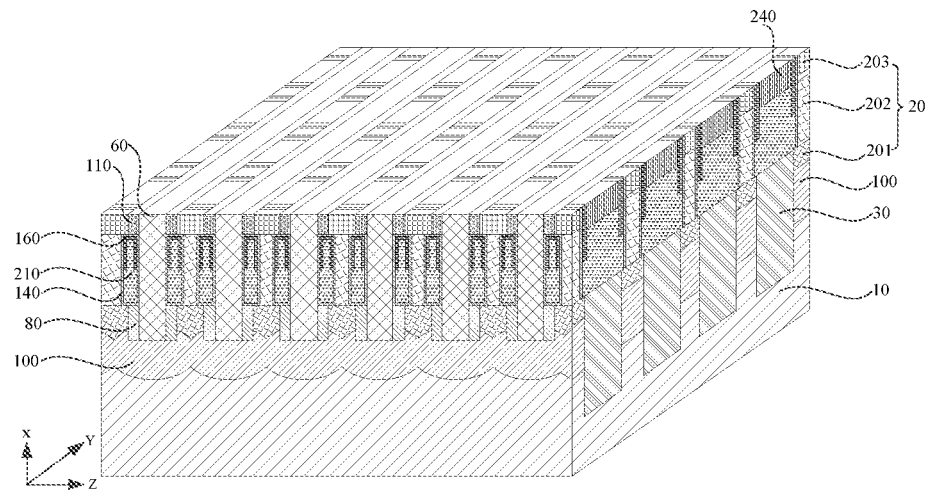
FIG. 18 is a schematic diagram of forming a word line structure and a second dielectric layer in a manufacturing method of a semiconductor structure according to an exemplary embodiment.

As shown in FIG. 16 to FIG. 18, in some other embodiments, the second gate oxide layer 160 may be formed by using the following method:

After the first gate oxide layer 140 is formed, the first gate oxide layer 140 located in the third trench 130 forms the fourth trench 150.

Referring to FIG. 16, a sacrificial layer 220 is formed in the fourth trench 150 by using the ALD process, the PVD process, or the CVD process. The sacrificial layer 220 fills the fourth trench 150. A material of the sacrificial layer 220 includes, but is not limited to, polycrystalline silicon.

Along the direction opposite to the first direction X, a part of the sacrificial layer 220 is removed through etching, where an etching endpoint of the sacrificial layer 220 may be between one-third and two-thirds of the height of the second segment 202. In an embodiment, the etching endpoint of the sacrificial layer 220 is located at the half height of the second segment 202. The fifth trench 180 is formed between the reserved sacrificial layer 220 and a sidewall of the first gate oxide layer 140.

Referring to FIG. 17, the second gate oxide layer 160 is formed in the fifth trench 180 and on the sidewall of the first gate oxide layer 140. In some embodiments, the second gate oxide layer 160 may be formed by using the ALD process. The second gate oxide layer 160 formed by using the ALD process can effectively isolate and protect the second segment, namely, the gate, of the active pillar when the second gate oxide layer 160 is relatively thin, and can avoid occupying large space, thereby facilitating subsequent filling or formation of another structure layer.

The reserved sacrificial layer 220 is removed through etching along the direction opposite to the first direction X. After the whole sacrificial layer 220 is removed, a seventh trench 230 is formed between a sidewall of the second gate oxide layer 160 and the sidewall of the first gate oxide layer 140 at a position of the removed sacrificial layer 220.

An initial word line structure is deposited in the seventh trench 230 by using the ALD process, the PVD process, or the CVD process. After that, a part of the initial word line structure is removed through etching, and the reserved initial word line structure forms the word line structure 210. A material of the word line structure 210 includes, but is not limited to, tungsten or polycrystalline silicon. It should be noted that an etching endpoint of the initial word line structure in this embodiment is the same as that of the word line structure formed in the above embodiment of forming the first word line 170 and the second word line 200.

In this embodiment, the word line structure 210 is formed by using one deposition process, and the process is simple and easy to control.

As shown in FIG. 15 and FIG. 18, in an embodiment, after the word line structure 210 is formed, a second dielectric layer 240 can be formed on a top surface of the word line structure 210 by using the ALD process, the PVD process, or the CVD process. Then, the top surface of the second dielectric layer 240 is processed through chemical mechanical polishing, such that a top surface of the reserved second dielectric layer 240 is flush with the top surface of the active pillar 20. The second dielectric layer 240 is formed on the word line structure 210, which makes it convenient to subsequently form another structure of the semiconductor structure on the substrate 10. A material of the second dielectric layer 240 may include, but is not limited to, silicon nitride, silicon dioxide, or silicon oxynitride.

As shown in FIG. 15, an exemplary embodiment of the present disclosure provides a semiconductor structure. The semiconductor structure includes a substrate 10, an active pillar 20, a first gate oxide layer 140, and a second gate oxide layer 160.

For example, there are a plurality of active pillars 20 that are arranged as an array on the substrate 10. Along a first direction X, the active pillar 20 includes a first segment 201, a second segment 202, and a third segment 203 that are sequentially connected. Along a second direction Y, sectional area of the second segment 202 is less than that of the first segment 201 and the third segment 203.

The first gate oxide layer 140 is disposed on a sidewall of the second segment 202, a top surface of the first segment 201, and a bottom surface of the third segment 203.

The second gate oxide layer 160 is disposed on an outer side of the first gate oxide layer 140, and the second gate oxide layer 160 is disposed close to the third segment 203. Along the first direction X, a length of the second gate oxide layer 160 is less than that of the first gate oxide layer 140, and a thickness of the second gate oxide layer 160 is greater than that of the first gate oxide layer 140. In some embodiments, the thickness of the second gate oxide layer 160 is 1 to 2 times that of the first gate oxide layer 140.

In this embodiment, the first gate oxide layer is formed on the sidewall of the second segment of the active pillar, and the second gate oxide layer is formed on the first gate oxide layer, so as to effectively reduce GIDL currents and interband tunneling. In addition, the length of the second gate oxide layer is less than that of the first gate oxide layer, the thickness of the second gate oxide layer is greater than that of the first gate oxide layer, and the second gate oxide layer is disposed close to the third segment, such that gate oxide layers with different thickness are formed at different positions of the second segment, which is conducive to controlling a turn-off current of the semiconductor structure and effectively improving performance and a yield of the semiconductor structure.

As shown in FIG. 15, in an embodiment, the semiconductor structure further includes a plurality of bit line isolation structures 30 and a plurality of word line isolation structures 60 disposed in the substrate 10.

The bit line isolation structures 30 are disposed at intervals along the second direction Y. The bit line isolation structure 30 is used to realize insulation between adjacent bit lines 100 subsequently formed in the substrate 10.

The word line isolation structures 60 are disposed at intervals along a third direction Z. The word line isolation structure 60 is used to realize insulation between adjacent word line structures 210 subsequently formed in the substrate 10.

It should be noted that a support structure 110 is disposed on both sides of the word line isolation structure 60. The support structure 110 facilitates subsequent formation of the active pillar 20 and improves accuracy of forming the first gate oxide layer 140 and the second gate oxide layer 160 on the second segment 202 of the active pillar 20.

As shown in FIG. 15, in some embodiments, the semiconductor structure further includes a plurality of bit lines 100 disposed in the substrate 10. The bit lines 100 are disposed at intervals along the second direction, and are located below the active pillars 20. In an embodiment, Co, an NiPt alloy, or the like can be implanted into the bottom of the active pillar 20 by using an ion implantation process, and the Co or the NiPt alloy reacts with the substrate 10 to form CoSi or PtNiSi. After annealing, the CoSi or the PtNiSi diffuses to a bottom surface of the active pillar 20 in the substrate 10 to form one bit line 100. The bit line 100 is connected to first segments 201 of a plurality of active pillars 20 that are along the third direction Z and in a same straight line. A first dielectric layer 80 is disposed between the bit line 100 and the word line isolation structure 60.

As shown in FIG. 15, in some embodiments, the semiconductor structure further includes a plurality of word line structures 210. The word line structures 210 are disposed at intervals along the third direction Z.

The word line structure 210 is disposed around the second segment 202 of the active pillar 20, such that a GAA transistor structure can be formed. The word line structure 210 includes a first word line 170 and a second word line 200 that are sequentially connected, a bottom surface of the first word line 170 is close to the first segment 201, and a top surface of the second word line 200 is close to the third segment 203, a plane perpendicular to the second direction Y is taken as a longitudinal section, and area of a longitudinal section of the first word line 170 is greater than that of a longitudinal section of the second word line 200.

It should be noted that a second dielectric layer 240 is formed on a top surface of the word line structure 210, which makes it convenient to subsequently form another structure of the semiconductor structure on the substrate 10.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the manufacturing method of a semiconductor structure and the semiconductor structure provided in the embodiments of the present disclosure, two gate oxide layers with different thicknesses are formed at different positions on a second segment of an active pillar, to effectively reduce a GIDL current, and improve performance and a field of the semiconductor structure.

The invention claimed is:

1. A manufacturing method of a semiconductor structure, comprising:
  providing a substrate;
  forming a plurality of active pillars on the substrate, wherein the active pillars are arranged as an array, each of the active pillars comprises, along a first direction, a first segment, a second segment, and a third segment that are sequentially connected, and along the first direction, sectional area of the second segment is less than that of the first segment and the third segment;
  forming a first gate oxide layer on a sidewall of the second segment, a top surface of the first segment, and a bottom surface of the third segment; and
  forming a second gate oxide layer on the first gate oxide layer, wherein along the first direction, a length of the second gate oxide layer is less than that of the first gate oxide layer, the second gate oxide layer is disposed close to the third segment, and a thickness of the second gate oxide layer is greater than that of the first gate oxide layer;
  wherein the forming a plurality of active pillars on the substrate comprises:
  forming a plurality of bit line isolation structures disposed at intervals along a second direction in the substrate, wherein the substrate between adjacent ones of the bit line isolation structures forms a strip body;
  processing the strip body to form a silicon pillar structure, wherein the silicon pillar structure comprises a first part, a second part and a third part along the first direction;
  forming a plurality of word line isolation structures disposed at intervals along a third direction in the substrate, wherein the second direction intersects the third direction on a same horizontal plane, and the silicon pillar structure between the adjacent ones of the bit line isolation structures and the silicon pillar structure between adjacent ones of the word line isolation structures form a silicon pillar; and
  preprocessing a part of the silicon pillar to form the active pillar.

2. The manufacturing method of a semiconductor structure according to claim 1, wherein the thickness of the second gate oxide layer is 1 to 2 times that of the first gate oxide layer.

3. The manufacturing method of a semiconductor structure according to claim 1, wherein the forming a plurality of bit line isolation structures disposed at intervals along a second direction in the substrate comprises:
  forming a plurality of bit line trenches disposed at intervals along the second direction in the substrate; and
  forming the bit line isolation structure in the bit line trench.

4. The manufacturing method of a semiconductor structure according to claim 3, wherein the forming a plurality of word line isolation structures disposed at intervals along a third direction in the substrate comprises:
  forming a plurality of word line trenches disposed at intervals along the third direction in the substrate, wherein along the first direction, a depth of the word line trench is less than that of the bit line trench;
  forming a first dielectric layer on a sidewall of the word line trench, and forming a first trench between first dielectric layers on two sidewalls of the word line trench along the second direction;
  forming the word line isolation structure in the first trench; and
  removing a part of the first dielectric layer to expose a top surface of the silicon pillar structure.

5. The manufacturing method of a semiconductor structure according to claim 4, wherein before the forming the word line isolation structure in the first trench, the manufacturing method of a semiconductor structure further comprises:
  forming a bit line at a bottom of the first trench, wherein there are a plurality of bit lines, the plurality of bit lines are disposed at intervals along the second direction.

6. The manufacturing method of a semiconductor structure according to claim 4, the manufacturing method of a semiconductor structure further comprises:
  forming a support structure on two sides of the word line isolation structure along the second direction.

7. The manufacturing method of a semiconductor structure according to claim 6, wherein the forming a support structure on two sides of the word line isolation structure comprises:
  removing a part of the first dielectric layer and a part of the bit line isolation structure to expose a part of the word line isolation structure and a part of the silicon pillar structure, and forming a second trench between the word line isolation structure and the silicon pillar structure along the second direction; and
  forming the support structure in the second trench.

8. The manufacturing method of a semiconductor structure according to claim 4, wherein the preprocessing a part of the silicon pillar to form the active pillar comprises:
  removing a part of the first dielectric layer and a part of the bit line isolation structure to expose the second part; and
  oxidizing the second part of the silicon pillar to partially remove the second part to form the active pillar, wherein the first part of the silicon pillar forms the first segment of the active pillar, the reserved second part of the silicon pillar forms the second segment of the active pillar, and the third part of the silicon pillar forms the third segment of the active pillar.

9. The manufacturing method of a semiconductor structure according to claim 8, wherein a third trench is formed between the second segment and the word line isolation structure; and
  the forming a first gate oxide layer on a sidewall of the second segment, a top surface of the first segment, and a bottom surface of the third segment comprises:
  forming the first gate oxide layer on a sidewall of the third trench by an atomic layer deposition (ALD) process, wherein the first gate oxide layer in the third trench forms a fourth trench.

10. The manufacturing method of a semiconductor structure according to claim 9, wherein the forming a second gate oxide layer on the first gate oxide layer comprises:
  forming a first initial word line in the fourth trench, wherein the first initial word line fills the fourth trench;
  removing a part of the first initial word line, taking the reserved first initial word line as a first word line, and forming a fifth trench between the first word line and the first gate oxide layer;
  forming the second gate oxide layer in the fifth trench and on a sidewall of the first gate oxide layer, such that a sidewall of the second gate oxide layer and a top surface of the first word line form a sixth trench;

forming a second initial word line in the sixth trench; and removing a part of the second initial word line, and taking the reserved second initial word line as a second word line, wherein the first word line and the second word line form a word line structure.

11. The manufacturing method of a semiconductor structure according to claim 10, the manufacturing method of a semiconductor structure further comprises:

forming a second dielectric layer on the word line structure, wherein a top surface of the second dielectric layer is flush with that of the active pillar.

12. The manufacturing method of a semiconductor structure according to claim 9, wherein the forming a second gate oxide layer on the first gate oxide layer comprises:

forming a sacrificial layer in the fourth trench, wherein the sacrificial layer fills the fourth trench;

removing a part of the sacrificial layer, and forming a fifth trench between the reserved sacrificial layer and a sidewall of the first gate oxide layer;

forming the second gate oxide layer in the fifth trench and on the sidewall of the first gate oxide layer;

removing the reserved sacrificial layer, and forming a seventh trench between a sidewall of the second gate oxide layer and the sidewall of the first gate oxide layer at a position of the removed sacrificial layer; and forming a word line structure in the seventh trench.

13. The manufacturing method of a semiconductor structure according to claim 12, further comprising:

forming a second dielectric layer on the word line structure, wherein a top surface of the second dielectric layer is flush with that of the active pillar.

* * * * *